United States Patent
Tsai et al.

(10) Patent No.: US 12,052,022 B2
(45) Date of Patent: Jul. 30, 2024

(54) COARSE-MOVER WITH SEQUENTIAL FINER TUNING STEP

(71) Applicant: Taiwan Semiconductor Manufacturing Company, Ltd., Hsinchu (TW)

(72) Inventors: Tsung-Hsien Tsai, Taoyuan County (TW); Jason Hsu, Hsinchu (TW); Ruey-Bin Sheen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/572,690

(22) Filed: Jan. 11, 2022

(65) Prior Publication Data

US 2023/0008340 A1   Jan. 12, 2023

Related U.S. Application Data

(60) Provisional application No. 63/219,865, filed on Jul. 9, 2021.

(51) Int. Cl.
*H03L 7/099* (2006.01)
*H03L 7/187* (2006.01)

(52) U.S. Cl.
CPC ............ *H03L 7/0992* (2013.01); *H03L 7/187* (2013.01)

(58) Field of Classification Search
CPC ....... H03L 7/187; H03L 7/099; H03L 7/0991; H03L 7/0992

USPC ........ 375/376; 327/147, 150, 156, 159, 165, 327/166, 291, 294, 298, 299

See application file for complete search history.

(56) References Cited

U.S. PATENT DOCUMENTS

| | | | |
|---|---|---|---|
| 8,953,730 B2* | 2/2015 | Chen | H03L 7/0992 |
| | | | 375/376 |
| 2010/0052795 A1* | 3/2010 | Nakamura | H03B 5/1265 |
| | | | 331/10 |
| 2017/0373694 A1 | 12/2017 | Roithmeier et al. | |

OTHER PUBLICATIONS

Taiwanese Office Action; Application No. 111108986; Dated Mar. 24, 2023.

* cited by examiner

*Primary Examiner* — Hai L Nguyen
(74) *Attorney, Agent, or Firm* — Jones Day

(57) ABSTRACT

A tuning array selection circuit, together with a decoder and a voltage controlled oscillator (VCO), can be employed to overcome some disadvantages of previous methods of phase locked loops. For example, a VCO can include a coarse tuning array and a fine tuning array. A coarse tuning array can be used to tune a VCO to generate a signal within a wide frequency range. A fine tuning array can be used to tune a VCO to generate a signal within a narrow frequency range. In one embodiment, the narrow frequency range is within the wide frequency range. The tuning array selection circuit can coordinate selection of appropriate fine tuning devices and narrow tuning devices to reduce transition jitter and the risk of fail locking of phase locked loops.

20 Claims, 14 Drawing Sheets

COARSE-MOVER WITH SEQUENTIAL FINER TUNING STEP

CROSS-REFERENCE TO RELATED APPLICATIONS

This application claims priority to U.S. Provisional Application No. 63/219,865, filed Jul. 9, 2021, entitled "Systems and Methods for Providing Coarse Mover with Sequential Tuning," which is incorporated herein by reference in its entirety.

TECHNICAL FIELD

The technology described in this disclosure generally relates to phase locked loop circuits.

BACKGROUND

A phase locked loop (PLL) circuit is an electronic control circuit that generates an output clock signal having a phase that is locked to the phase of an input reference signal. For example, a PLL can be used to adjust an oscillator so that a frequency and phase of a signal generated by the oscillator matches the frequency and phase of a reference input signal. A PLL circuit is commonly used in communication devices, computers, and other electronic devices. A high performance PLL may employ an inductor/capacitor voltage controlled oscillator (LC voltage controlled oscillator) for high-end applications. For example, an LC voltage controlled oscillator may be employed in fifth-generation mobile systems, radar, and high performance computing applications.

A small voltage controlled capacitor (varactor) may be employed to improve the phase noise of LC voltage controlled capacitors. However, the small voltage controlled capacitors may cause a very narrow frequency tuning range which can result in a high risk of fail locking of the phase locked loop during variations in temperature or voltage. In addition, a large transition jitter may be induced by frequency adjustments within a voltage controlled oscillator. A solution is needed to reduce the risk of fail locking and to reduce the transition jitter caused by frequency adjustments.

BRIEF DESCRIPTION OF THE DRAWINGS

Aspects of the present disclosure are best understood from the following detailed description when read with the accompanying figures.

DETAILED DESCRIPTION

Figure 1:
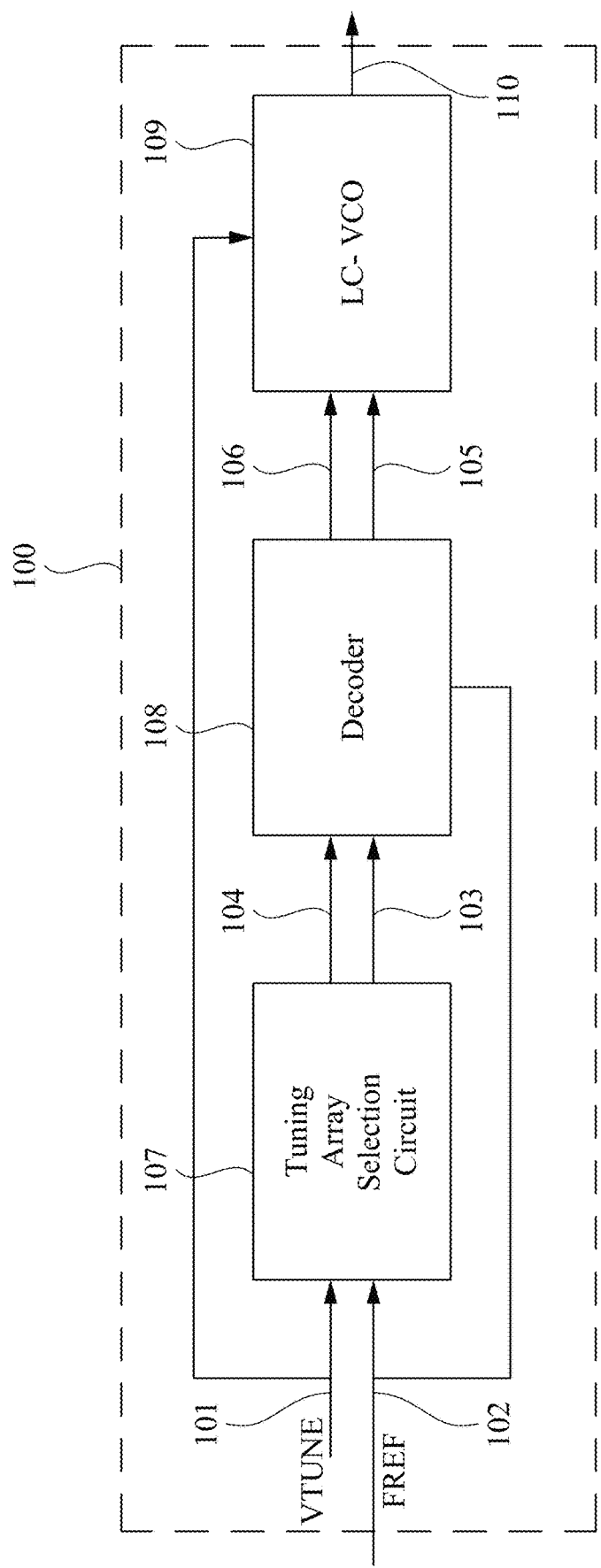
FIG. 1 is a block diagram of an exemplary tuning array selection circuit, decoder, and LC voltage controlled oscillator, as implemented in a phase locked loop.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

A phase locked loop (PLL) can be used to adjust its oscillator so that a frequency and/or a phase of an output signal generated by the oscillator is proportional to a frequency and/or a phase of a reference input signal. The PLL includes a phase and/or frequency detector that provides an error signal representing a difference, in frequency and/or phase, between the output signal and the reference input signal. This error signal can be measured to ensure that the frequency and/or the phase of the output signal is proportional to the frequency and/or the phase of the reference signal. For example, as the PLL adjusts the oscillator, the frequency and/or the phase of the output signal can gradually become closer to the frequency and/or the phase of the reference input signal. When the frequency and the phase of the output signal is proportional to the frequency and/or the phase of the reference input signal, the PLL is said to be locked onto the reference input signal. In some applications, a phase locked loop may employ an LC voltage controlled oscillator for generation of this output signal in high-end computing and mobile applications.

FIG. 1 is a block diagram of a phase locked loop 100. In the present disclosure, the phase locked loop 100 includes a tuning array selection circuit 107, a decoder 108, and a LC voltage controlled oscillator 109. The tuning array selection circuit 107 is configured to receive both a VCO tuning signal 101 and a reference input signal 102. The VCO tuning signal 101 may originate from within the phase locked loop 100. For example, the VCO tuning signal 101 may be generated by a control loop within the phase locked loop 100. The tuning array selection circuit 107 is configured to utilize the VCO tuning signal 101 and the reference input signal 102 to determine whether the VCO tuning signal 101 is above, below, or within an analog voltage range. The tuning array selection circuit 107 is configured to generate a fine tuning binary code signal 104 and a coarse tuning binary code signal 103 based upon this determination. These binary code signals (103, 104) may be received by the decoder 108, along with the reference input signal 102. The decoder 108 can convert these binary code signals (103, 104) into fine tuning selection signals 106 and coarse tuning selection signals 105. The fine tuning selection signals 106 and coarse tuning selection signals 105 may then be received at the LC voltage controlled oscillator 109, which can use these selection signals (105, 106) to select appropriate fine tuning and coarse tuning devices. The LC voltage controlled oscillator 109 is also configured to receive the VCO tuning signal 101 and to generate a VCO output signal 110 that has a frequency that is proportional to the frequency of the reference input signal 102.

Figure 2:
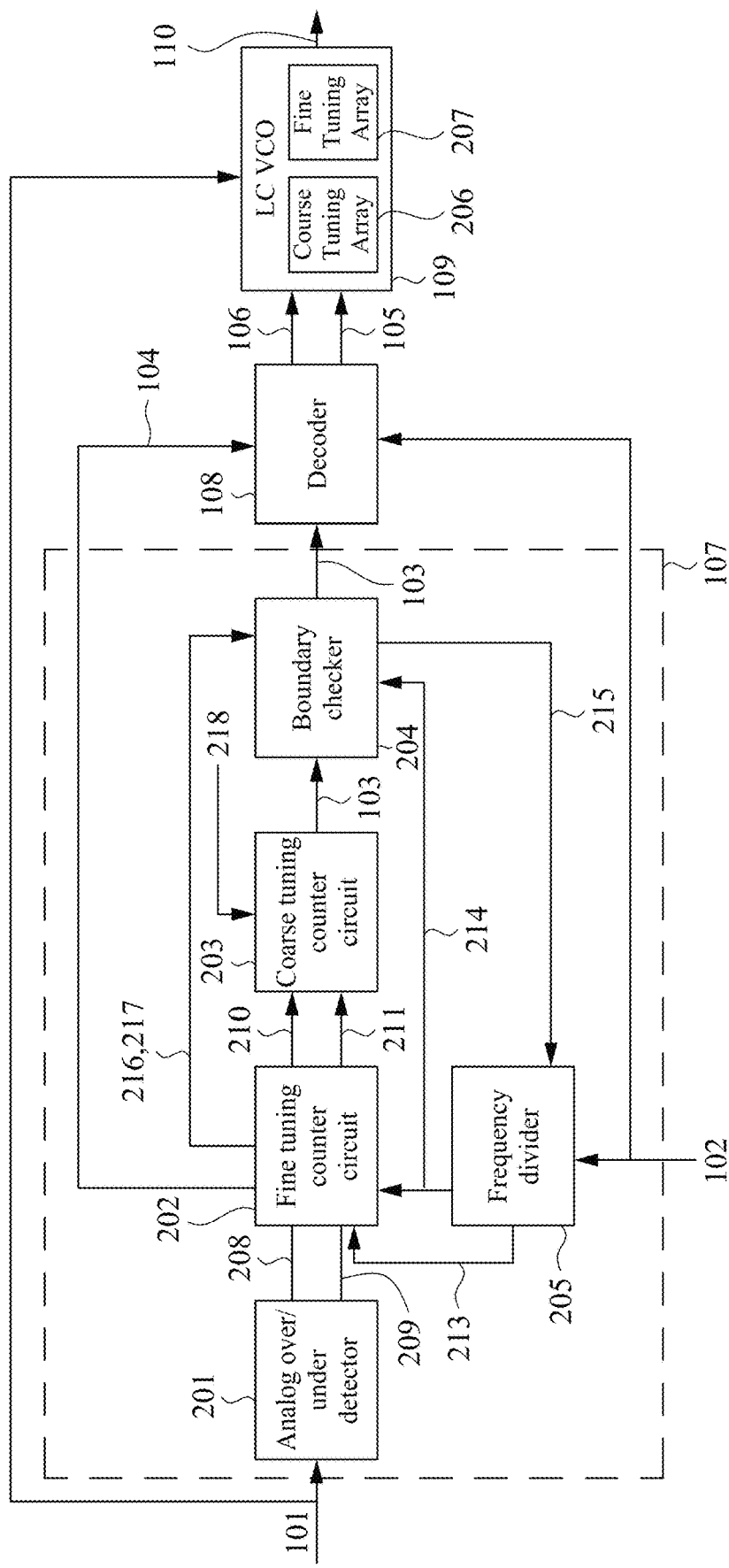
FIG. 2 is a detailed block diagram of an exemplary tuning array selection circuit, decoder, and LC voltage controlled oscillator.

FIG. 2 is a more detailed diagram of the tuning array selection circuit 107, the decoder 108, and the LC voltage controlled oscillator 109. In the example shown in FIG. 2, the tuning array selection circuit 107 includes an analog overflow and underflow detector 201, a fine tuning counter circuit 202, a coarse tuning counter circuit 203, a boundary checker 204, and a frequency divider 205. The analog overflow and underflow detector 201 may receive the VCO tuning signal 101. Based upon a determination that the VCO tuning signal 101 is above, below, or within an analog voltage range, the analog overflow and underflow detector 201 may generate an overflow signal 208 or an underflow signal 209. Both the overflow 208 and underflow 209 signals can be received at the fine tuning counter circuit 202, together with a first reduced frequency signal 213 and a second reduced frequency signal 214. The fine tuning counter circuit 202 may be configured to determine whether selection of a different fine tuning device within the fine tuning array 207 of the LC voltage controlled oscillator 109 is appropriate based upon these overflow 208 and underflow 209 signals. The fine tuning counter circuit 202 may also be configured to generate one or more frequency level boundary signal, including an upper frequency level boundary signal 210 and a lower frequency level boundary signal 211, corresponding to a fine tuning device generating a frequency at an upper or lower boundary of a wide frequency range, as further discussed below. The fine tuning counter circuit 202 may be configured to also generate a fine tuning binary code signal 104 corresponding to selection of an appropriate fine tuning device within the fine tuning array 207 of the LC voltage controlled oscillator 109.

The tuning array selection circuit 107 may further comprise a coarse tuning counter circuit 203. In one example, the coarse tuning counter circuit 203 is configured to receive these frequency level boundary signals (210, 211), together with a second reduced frequency signal 214 and a coarse tuning binary code input signal 218. In one example, the coarse tuning binary code input signal 218 is an input signal and is used to select the initial coarse tuning binary code signal. The coarse tuning counter circuit 203 may be further configured to generate a coarse tuning binary code signal 103. In one example, the coarse tuning binary code signal 103 is determined based upon the frequency level boundary signals (210, 211) and the coarse tuning binary code input signal 218.

The boundary checker 204 is configured to receive the coarse tuning binary code signal 103, as well as VCO overflow tuning signal 216 and VCO underflow tuning signal 217 from the fine tuning counter circuit 202. These signals can be used to determine whether enablement of the tuning array selection circuit 107 is appropriate. The boundary checker 204 may generate an enablement signal 215 based on such a determination, that can be used to enable or disable the tuning array selection circuit 107.

The tuning array selection circuit 107 may also include a frequency divider 205. In one example embodiment, the frequency divider 205 may be configured to receive an input reference signal 102. The frequency divider 205 may then divide this input reference signal 102 by a first predetermined constant and generate a first reduced frequency signal 213. This first reduced frequency signal 213 can be received by the fine tuning counter circuit 202. The frequency divider 205 may also divide this input reference signal 102 by a second predetermined constant and generate a second reduced frequency signal 214, which may be received as "clock" inputs to one or more latches in the fine tuning counter circuit 202, the coarse tuning counter circuit 203, and the boundary checker 204, as understood by one skilled in the art.

The decoder 108 is also shown in FIG. 2. The decoder 108 may be configured to receive the coarse tuning binary code signal 103 from the boundary checker 204, the fine tuning binary code signal 104 from the fine tuning counter circuit 202, and the reference input signal 102. The coarse tuning binary code signal 103 and the fine tuning binary code signal 104 may be converted to one or more fine tuning selection signals 106 and one or more coarse tuning selection signals 105 by the decoder 108. The decoder 108 may convert the binary code signals (103, 104) to selection signals (105, 106), for example, because the selection signals (105, 106) may be utilized for the selection of individual devices more readily than binary code signals (103, 104).

FIG. 2 also shows the LC voltage controlled oscillator 109. The LC voltage controlled oscillator 109 may include a coarse tuning array 206 and a fine tuning array 207. For example, the coarse tuning array 206 may include a plurality of coarse tuning devices and the fine tuning array 207 may include a plurality of fine tuning devices. The coarse tuning array 206 may be configured to tune the LC voltage controlled oscillator 109 to generate the VCO output signal 110 having a frequency within a wide frequency range. By contrast, the fine tuning array 207 may be configured to tune the LC voltage controlled oscillator 109 to generate the VCO output signal 110 having a frequency within a narrow frequency range. In one example, this narrow frequency range is within the wide frequency range.

Figure 3:
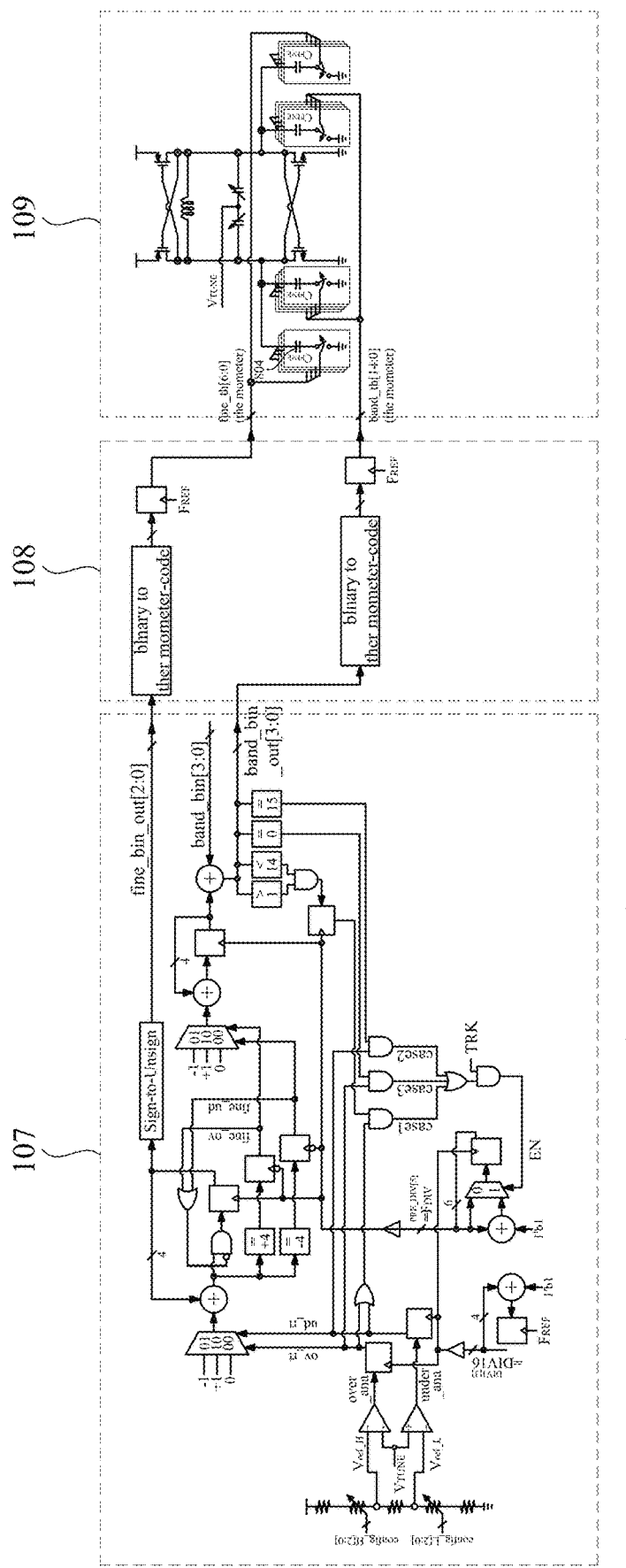
FIG. 3 is a diagram of the detailed components of an exemplary tuning array selection circuit, decoder, and LC voltage controlled oscillator.

FIG. 3 is a detailed diagram of the tuning array selection circuit 107, the decoder 108, and the LC voltage controlled oscillator 109. The detail shown in FIG. 3 is discussed further below.

Figure 4:
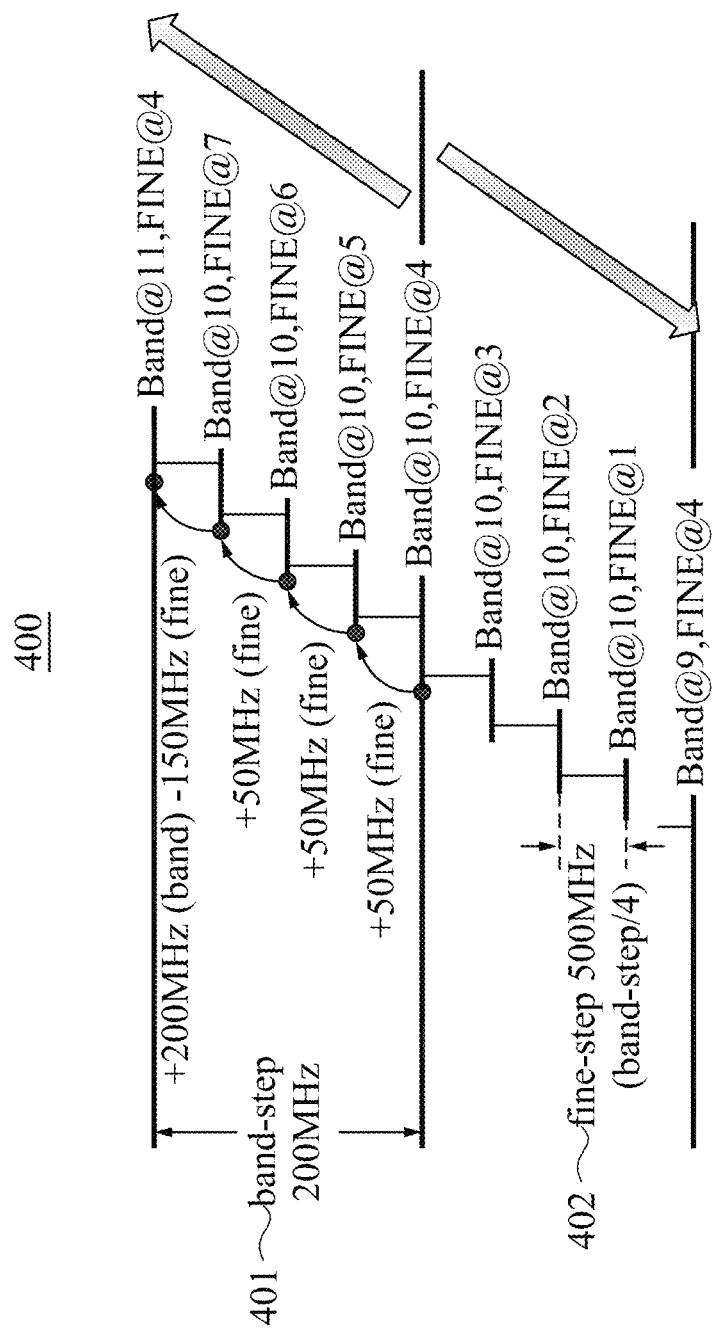
FIG. 4 is a diagram showing how a voltage controlled oscillator may adjust a VCO output signal.

FIG. 4 is a diagram detailing the mechanism by which the LC voltage controlled oscillator 109 may adjust the VCO output signal 110 by selecting appropriate coarse tuning and fine tuning devices. According to the example shown in FIG. 4, a fine tuning device may represent a narrow frequency range 402 of 50 MHz. A coarse tuning device, however, may represent a wide frequency range 401 of 200 MHz. The tuning array selection circuit 107, the decoder 108, and the LC voltage controlled oscillator 109 may coordinate to adjust the frequency of the VCO output signal 110 in steps equal to the frequency step of a fine tuning device, so as to reduce the transition jitter induced by such a frequency change. For example, a fine tuning device may be selected which corresponds to a frequency range at an upper frequency level within the wide frequency range 401. This operation state is represented by "Band@10, FINE@7" in FIG. 4. In this example, 10 and 7 are variables that are used to indicate which coarse tuning device and which fine tuning device is selected, respectively. If a fine tuning device is selected that corresponds to a frequency range at an upper frequency level within the wide frequency range 401 and a VCO tuning signal 101 is above an analog voltage range, a coarse tuning device representing an increase in frequency will be selected. This is demonstrated in FIG. 4 by the coarse tuning device moving from "Band@10" to "Band@11." In the example shown in FIG. 4, this corresponds to a frequency increase in the VCO output signal 110 of 200 MHz. However, a fine tuning device is selected that corresponds to a lower level within the wide frequency range 401. This is indicated in FIG. 4 by the fine tuning device moving from "FINE@7" to "FINE@4." Thus, in this example the frequency represented by the coarse tuning device has increased by 200 MHz. However, the frequency represented by the fine tuning device has decreased by 150 MHz. Thus, there is a net increase in frequency of the VCO output signal 110 of 50 MHz. The transition jitter induced in the phase locked loop 100 is less than the transition jitter that would have been induced by a frequency increase greater than 50 MHz (for example, a frequency increase equal to the frequency of a coarse tuning device).

Figure 5:
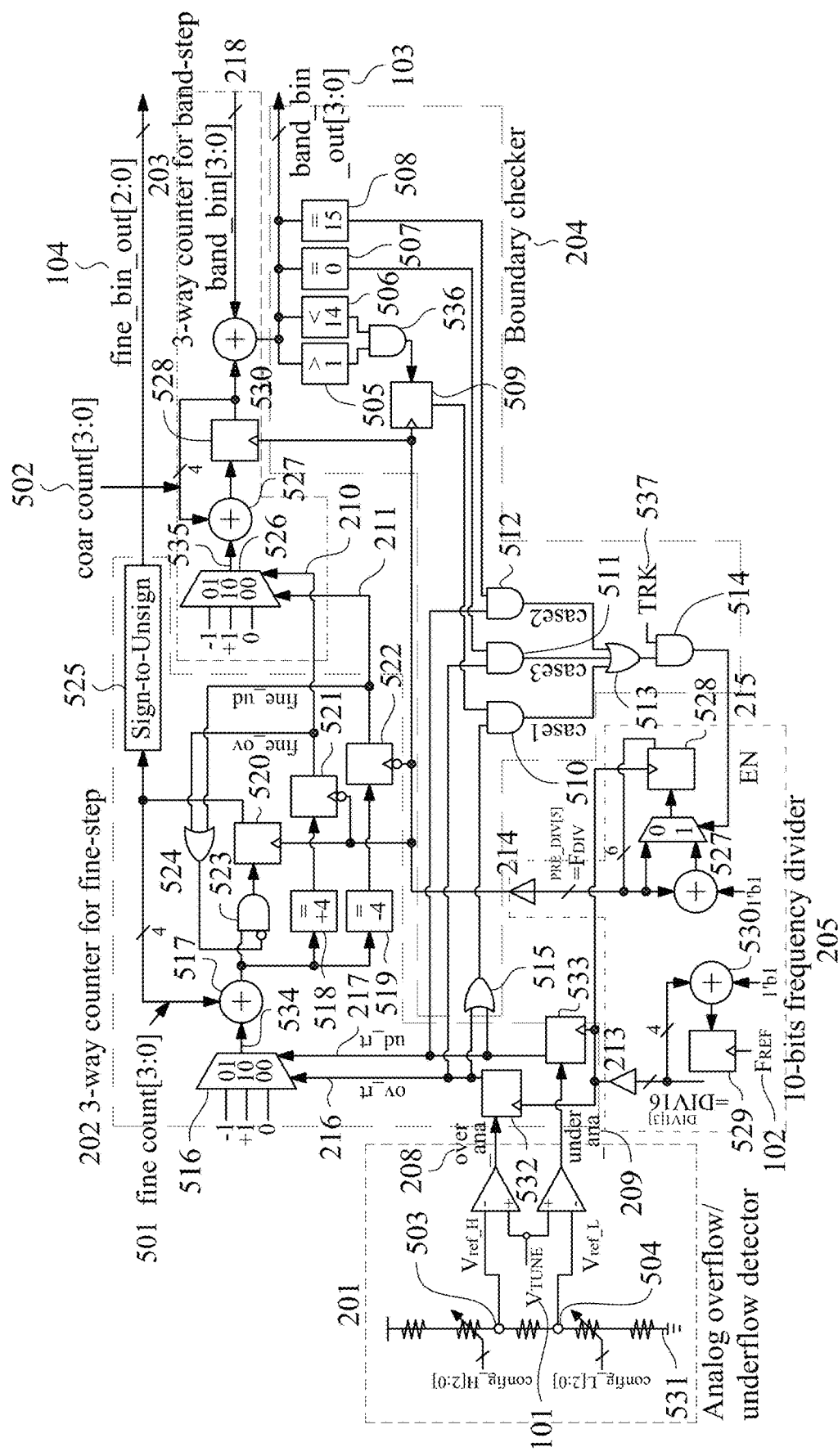
FIG. 5 is a detailed diagram of a tuning array selection circuit.

FIG. 5 shows a detailed implementation of the tuning array selection circuit 107. In the example embodiment shown in FIG. 5, the VCO tuning signal VTUNE 101 may be received as an input at the positive terminals of amplifiers within the analog overflow and underflow detector 201. These amplifiers may be coupled to a voltage divider 531 by their negative terminals. A first node 503 on the voltage divider 531 may represent a high predetermined value, and a second node 504 on the voltage divider may represent a low predetermined value. The high and low predetermined values (504, 503) may correspond to the limits of an analog voltage range. The VCO tuning signal 101 can be compared to this high and low predetermined value, and the amplifiers may generate overflow signal over_ana 208 and underflow signal under_ana 209 depending on whether the VCO tuning signal VTUNE 101 is above, below, or within the analog voltage range. For example, an overflow signal over_ana 208 may be enabled when the VCO tuning signal VTUNE 101 is above the analog voltage range, and an underflow signal under_ana 209 may be enabled when the VCO tuning signal VTUNE 101 is below the analog voltage range.

The overflow 208 and underflow 209 signals may be received by the fine tuning counter circuit 202 as inputs. For example, the overflow signal over_ana 208 may be received as an input by a first data latch 532, and the underflow signal under_ana 209 may be received as an input to a second data latch 533 within the fine tuning counter circuit 202. These data latches (532, 533) may also receive a first reduced frequency signal 213 from the frequency divider 205, and the same data latches (532, 533) may produce a VCO overflow tuning signal ov_rt 216 and a VCO underflow tuning signal ud_rt 217. The VCO overflow tuning signal ov_rt 216 and VCO underflow tuning signal ud_rt 217 may be received at a first multiplexer 516 that can utilize these signals to produce a fine tuning adder signal 534. This fine tuning adder signal 534 can be received by a first adder 517. The output of this first adder 517 can be received by a second logic (AND) gate 523, a first digital comparator 518, and a second digital comparator 519. In one example embodiment, the output of the first digital comparator 518 is enabled when the output of the first adder 517 is equal to a predetermined value, and the output of the second digital comparator 519 is enabled when the output of the first adder 517 is equal to a separate predetermined value. The output of the first digital comparator 518 may correspond to a determination that the selected fine tuning device within the fine tuning array 207 corresponds to a frequency at an upper level within the wide frequency range 401. Similarly, the output of the second digital comparator 519 may correspond to a determination that the selected fine tuning device within the fine tuning array 207 corresponds to a frequency at a lower level within the wide frequency range 401.

The output of the second logic (AND) gate 523 may be received as an input to a third data latch 520, and the output of the first digital comparator 518 may be received as an input to a fourth data latch 521. The output of the second digital comparator 519 may be received as an input to a fifth data latch 522. The fourth data latch 521 that is coupled to the first digital comparator 518 may produce a fine tuning range overflow signal fine_ov 210, and the fifth data latch 522 that is coupled to the second digital comparator 519 may produce a fine tuning range underflow signal fine_ud 211. In one example, the fine tuning range overflow and underflow signals (210, 211) may correspond to a determination that the narrow frequency range 402 is at an upper or lower level within the wide frequency range 401.

The fine tuning range overflow signal 210 and the fine tuning range underflow signal 211 can be received at a first logic (OR) gate 524 within the fine tuning counter circuit 202 that is enabled when either signal (210, 211) is enabled. The output of the first logic (OR) gate 524 may be received at an inverted input node of a second logic (AND) gate 523. As discussed above, the output of this second logic (AND) gate 523 may be received at data latch 520. The output of data latch 520 may be a fine tuning counter variable fine_count[3:0] 501 and be received at both the first adder 517 and a sign-to-unsign block 525. In one example, the fine tuning counter variable fine_count[3:0] 501 is a signed binary number, which may either be a positive or negative representation of a binary number. The sign-to-unsign block 525 may transfer this positive or negative binary number to a positive binary number, and generate fine tuning binary code signal fine_bin_out[2:0] 104. For example, sign-to-unsign block 525 may receive fine tuning counter variable fine_count[3:0] 501 at a value of "1101," which corresponds to −3 in a base-ten numeric system, and generate fine tuning binary code signal fine_bin_out[2:0] 104 with a value of "001," which corresponds to 1 in a base-ten numeric system. Similarly, sign-to-unsign block 525 may receive fine tuning counter variable fine_count[3:0] 501 at a value of "0011," which corresponds to 3 in a base-ten numeric system, and generate fine tuning binary code signal fine_bin_out[2:0] 104 with a value of "111," which corresponds to 7 in a base-ten numeric system.

The fine tuning range overflow fine_ov 210 and fine tuning range underflow fine_ud 211 signals can also be received as inputs to a second multiplexer 526 within the coarse tuning counter circuit 203. This multiplexer 526 can be used to generate an output signal 535 based on whether a different coarse tuning device should be selected, depending upon the fine tuning range overflow fine_ov 210 and underflow fine_ud 211 signals. This output signal 535 may be received at a second adder 527. The output of this second adder 527 may be received as an input to a sixth data latch 528. The output of this sixth latch 528 may be received at a third adder 530, together with a coarse tuning binary code input signal band_bin[3:0] 218. In one embodiment, the coarse tuning binary code input signal band_bin[3:0] 218 is used to set the initial value of the coarse tuning binary code signal band_bin_out[3:0] 103. The output of this sixth latch 528 may also be coupled to the second adder 527, and the output of the sixth latch 528 may be coarse tuning counter variable coar_count[3:0] 502. The output of the third adder 530 can serve as a coarse tuning binary code signal band_bin_out[3:0] 103 which can be received by the decoder 108.

The coarse tuning binary code signal band_bin_out[3:0] 103 can be coupled to a third digital comparator 505, a fourth digital comparator 506, a fifth digital comparator 507, and a sixth digital comparator 508 within the boundary checker 204. In the example embodiment shown in FIG. 5, the coarse tuning binary code signal band_bin_out[3:0] 103 is limited between 0 and 15. The third, fourth, fifth, and sixth digital comparators (505, 506, 507, 508) can assist the boundary checker 204 in preventing the exhaustion of the coarse tuning binary code signal band_bin_out[3:0] 103 and collapse of the system. For example, in the embodiment shown in FIG. 5, the output of the third digital comparator 505 will be enabled if the coarse tuning binary code signal band_bin_out[3:0] 103 is greater than 1 and the output of the fourth digital comparator 506 will be enabled if the coarse tuning binary code signal band_bin_out[3:0] 103 is less than 14. If the output of both of these digital comparators (505, 506) are enabled, a selection of a coarse tuning device corresponding to a greater wide frequency range 401 or a lower wide frequency 401 would be allowable. Thus, the output of the third and fourth digital comparators (505, 506) are coupled to separate inputs of a logic (AND) gate 536. The output of this logic (AND) gate 536 is coupled to an input of a seventh data latch 509, and the output of this seventh data latch 509 is coupled to a fourth logic (AND) gate 510. The other input of this logic (AND) gate 510 is coupled to a logic (OR) gate 515, that receives as its inputs both the VCO overflow tuning signal ov_rt 216 and VCO underflow tuning signal ud_rt 217 from the fine tuning counter circuit 202. The output of the fourth logic (AND) gate 510 is one of three inputs of a logic (OR) gate 513. Each of the three inputs of the logic (OR) gate 513 represents a condition at which the tuning array selection circuit 107 may be enabled. For example, the output of the fifth digital comparator 507 is enabled when the coarse tuning binary code signal band_bin_out[3:0] 103 is equal to 0. This output, as well as the VCO overflow tuning signal 216, is received as an input at the fifth logic (AND) gate 511. Similarly, the output of the sixth digital comparator 508 is enabled when the coarse tuning binary code signal band_bin_out[3:0] 103 is equal to 15. This output is received as an input at logic (AND) gate 512, together with the VCO underflow tuning signal ud_rt 217.

The output of the seventh logic (OR) gate 513 is received at an eighth logic (AND) gate 514, together with a tracking signal 537. The output of this logic (AND) gate 514 is the enablement signal EN 215 used to control enablement of the tuning array selection circuit 107. Thus, when the fourth logic (AND) gate 510, the fifth logic (AND) gate 511, and the sixth logic (AND) gate 512 are all disabled, the tuning array selection circuit 107 will be disabled to prevent collapse of the system.

FIG. 5 also shows a frequency divider 205. In one example embodiment, the frequency divider 205 receives an reference input signal 102. The frequency divider 205 may also receive the enablement signal EN 215 from the boundary checker 204. The reference input signal 102 may be received at a ninth data latch 529. The frequency divider 205 may be configured to generate a first reduced frequency signal 213 that is equal to the frequency of the reference input signal 102 divided by a first predetermined value. The frequency divider 205 may also be configured to generate a separate, second reduced frequency signal 214 that is equal to the frequency of the reference input signal 102 divided by a second predetermined value. Such signals of differing frequency may be received at different components depending on their differing frequency requirements.

Figure 6:
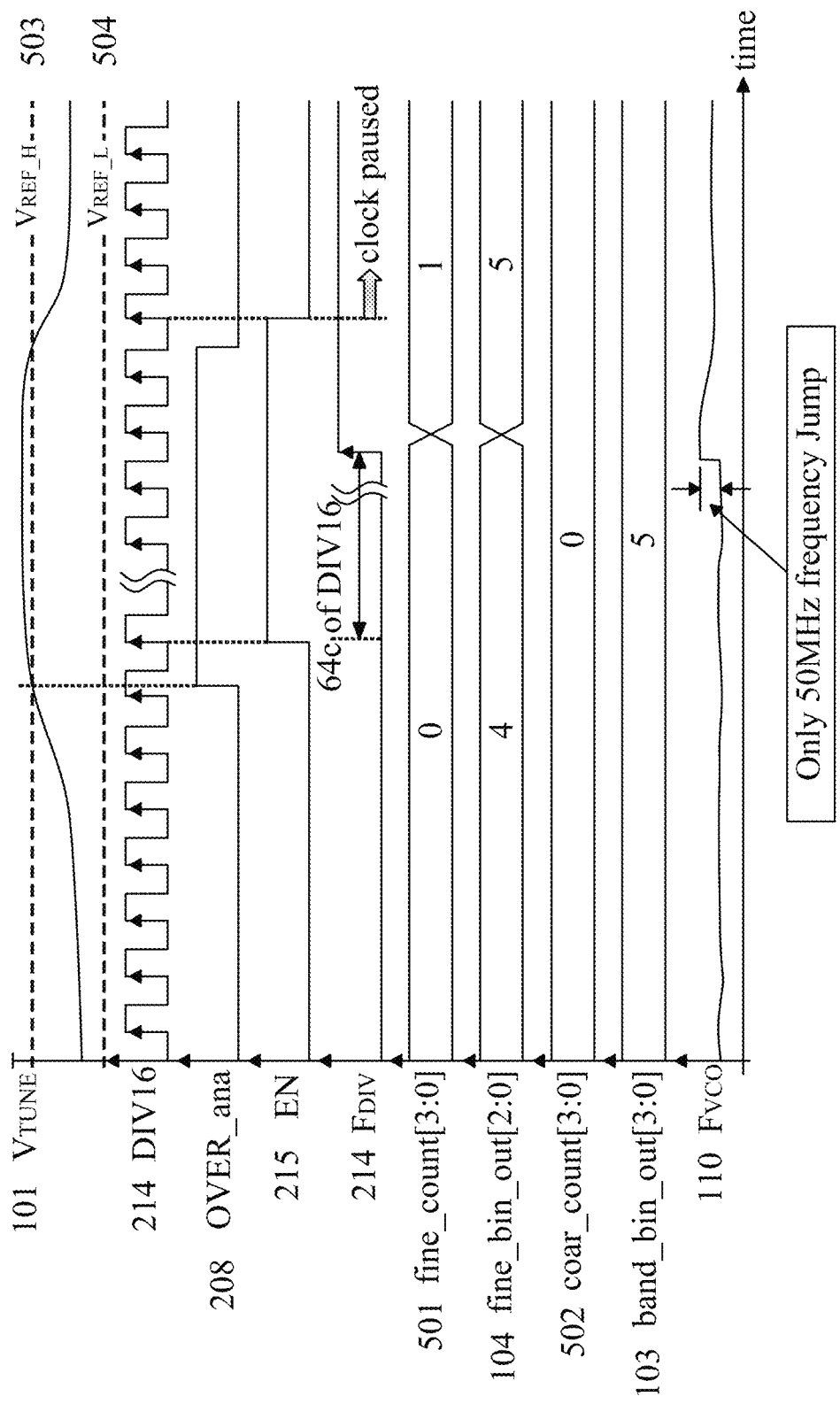
FIG. 6 is a timing diagram of various signals within the tuning array selection circuit during a condition in which a VCO tuning signal is slightly above an analog voltage range.

FIG. 6 is a timing diagram showing a selection of a change in selection of a fine tuning device. In one example embodiment, the value of the fine tuning counter variable fine_count[3:0] 501 is limited between −4 and +4. In the example shown in FIG. 6, the fine tuning counter variable fine_count[3:0] 501 is received at the sign-to-unsign block 525, and is converted into the fine tuning binary code signal fine_bin_out[2:0] 104. The coarse tuning counter variable coar_count[3:0] 502 may be combined with an unsigned binary code input signal band_bin[3:0] 218 to generate a new coarse tuning binary code signal band_bin_out[3:0] 103. This coarse tuning binary code signal band_bin_out[3:0] 103 may be limited between 0 and 15.

The phase locked loop 100 may increase the VCO tuning signal $V_{TUNE}$ 101 to maintain the VCO output signal 110. However, the VCO tuning signal 101 may exceed the high predetermined value within the analog overflow and underflow detector 201, which may enable overflow signal over_ana 208, and enable the frequency divider 205 with the enable signal EN 215. If the VCO tuning signal 101 still exceeds the high predetermined value within the analog overflow and underflow detector 201 after 64 cycles of the second reduced frequency signal 214 (1024 cycles of the input reference signal $F_{REF}$ 102), the fine tuning counter variable fine_count[3:0] 501 will increase by 1. The fine tuning binary code signal fine_bin_out[2:0] 104 will increase (e.g., from 4 to 5), which will slightly increase the frequency of the VCO output signal 110. In the example shown in the timing diagram of FIG. 6, the phase locked loop 100 will sense that the frequency of the VCO output signal 110 is sufficiently locked to the frequency of the reference input signal 102, that the VCO tuning signal VTUNE 101 is within the analog voltage range, and the operation of the tuning array selection circuit 107 will stop.

Figure 7:
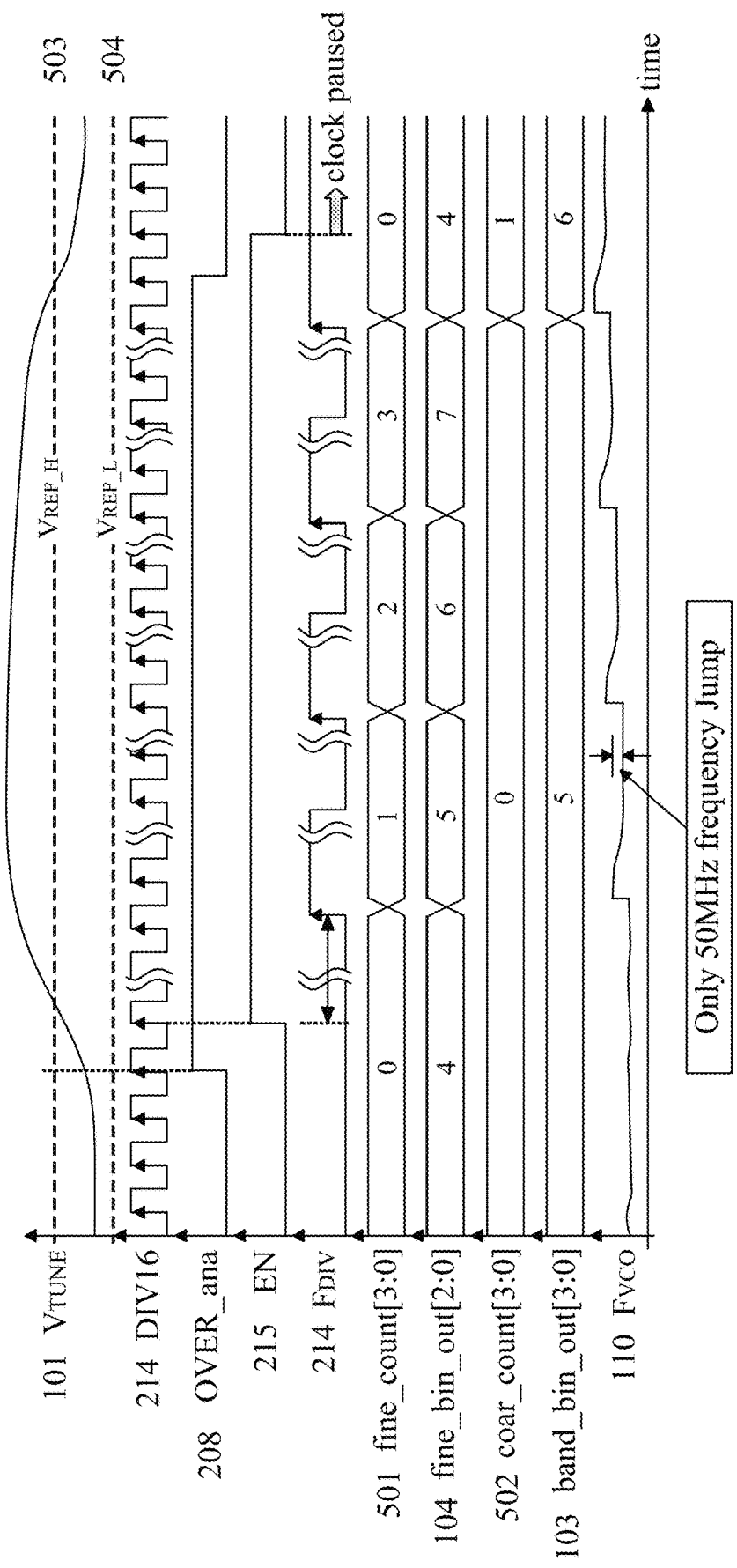
FIG. 7 is a timing diagram of various signals within the tuning array selection circuit during a condition in which a VCO tuning signal is significantly above an analog voltage range.

FIG. 7 is a timing diagram showing an operation in which another coarse tuning device within the coarse tuning array 206 is selected. In the example demonstrated in FIG. 7, fine tuning counter variable fine_count[3:0] 501 increases to 3 and overflow signal 208 is still enabled. This triggers the signal of upper frequency level boundary signal fine_ov 210. In this case, the coarse tuning counter variable coar_count[3:0] 502 increases from 0 to 1 and the coarse tuning binary code signal band_bin_out[3:0] 103 increases from 5 to 6. Simultaneously, the fine tuning counter variable fine_count[3:0] 501 is reset to 0 to force the fine tuning binary code signal fine_bin_out[2:0] 104 to return to a value of 4. Thus, the overall frequency increase of the VCO output signal 110 is only 50 MHz. This is because the change in value of the fine tuning counter variable fine_count[3:0] 501 results in a frequency decrease of 150 MHz and the change in value of the coarse tuning counter variable coar_count[3:0] 502 results in a frequency increase of 200 MHz.

Figure 8:
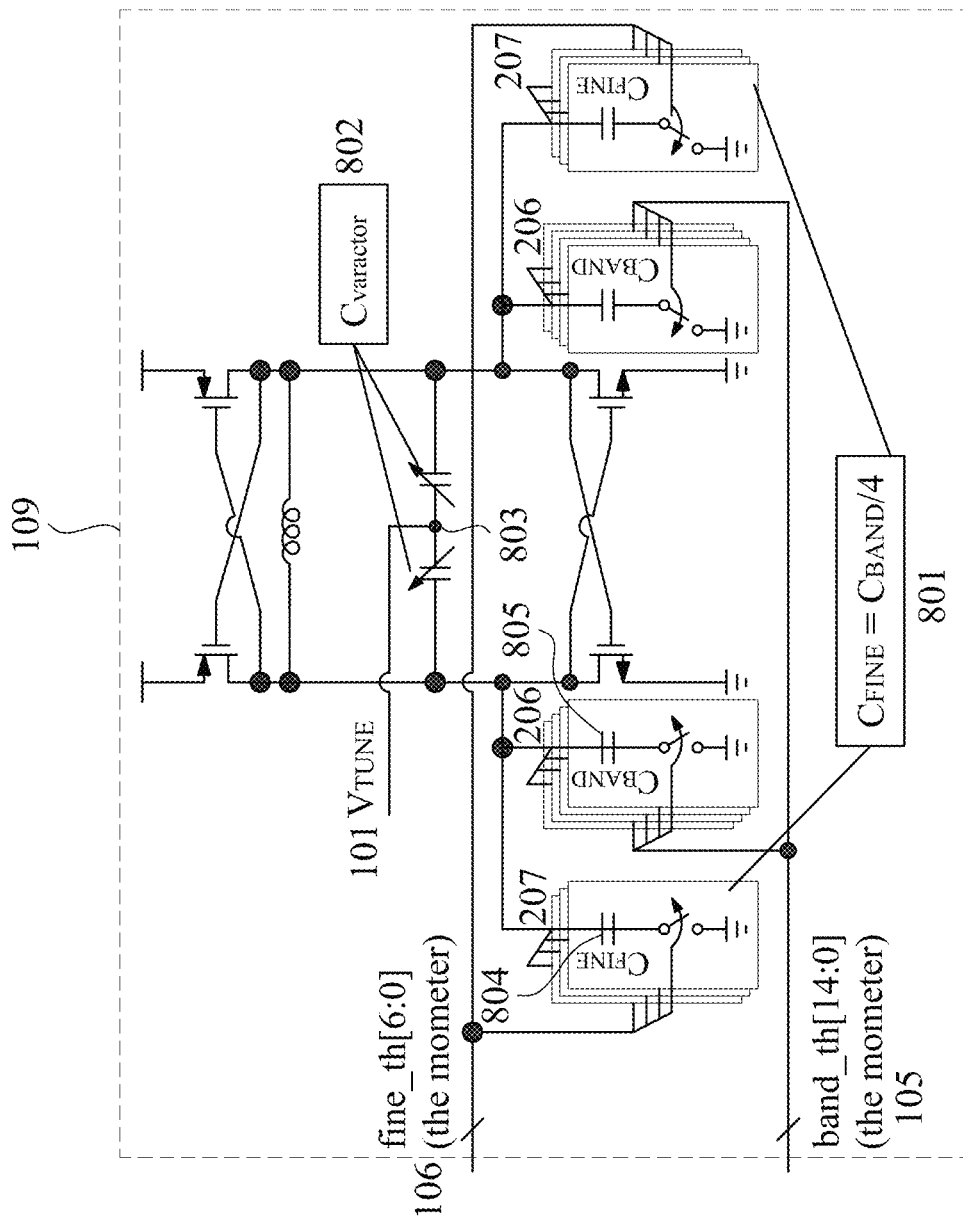
FIG. 8 is a detailed diagram of an LC voltage controlled oscillator.

FIG. 8 is a detailed diagram of one embodiment of the LC voltage controlled oscillator 109. The VCO tuning signal $V_{TUNE}$ 101 can be received at a node 803 of a LC voltage controlled oscillator 109 that is coupled to voltage controlled capacitors (varactors) 802 on either side. The LC voltage controlled oscillator 109 may include a fine tuning array 207 and a coarse tuning array 206. In the example shown in FIG. 8, the fine tuning array 207 includes a plurality of fine tuning devices 804 and the coarse tuning array 206 includes a plurality of coarse tuning devices 805. In the embodiment shown in FIG. 8, the coarse tuning devices 805 and the fine tuning devices 804 are capacitors. The coarse tuning selection signals band_th[14:0] 105 may be received as an input to the coarse tuning array 206, and the fine tuning selection signals fine_th[6:0] 106 may be received as an input to the fine tuning array 207.

For example, the LC voltage controlled oscillator 109 may include 2 MOM capacitor arrays, as understood by one skilled in the art. The coarse tuning arrays 206 may be designed to cover wide frequency tuning. In one example, the coarse tuning array 206 may contain 15 steps with 200 MHz per step. Thus, the LC voltage controlled oscillator 109 may be have a frequency tuning range of 3 GHz. The fine tuning arrays 207 may be designed to generate a small step size. The fine tuning array 207 may only contain 7 steps with 50 MHz per step. In this example the frequency step size of a fine tuning device 804 is one fourth the step size of a coarse tuning device 805. This is represented in equation 801 in FIG. 8. However, the ratio of the fine tuning device step size to the coarse tuning device step size may be one eighth, one tenth, etc. This ratio may depend on different design requirements or different applications.

Figure 9:
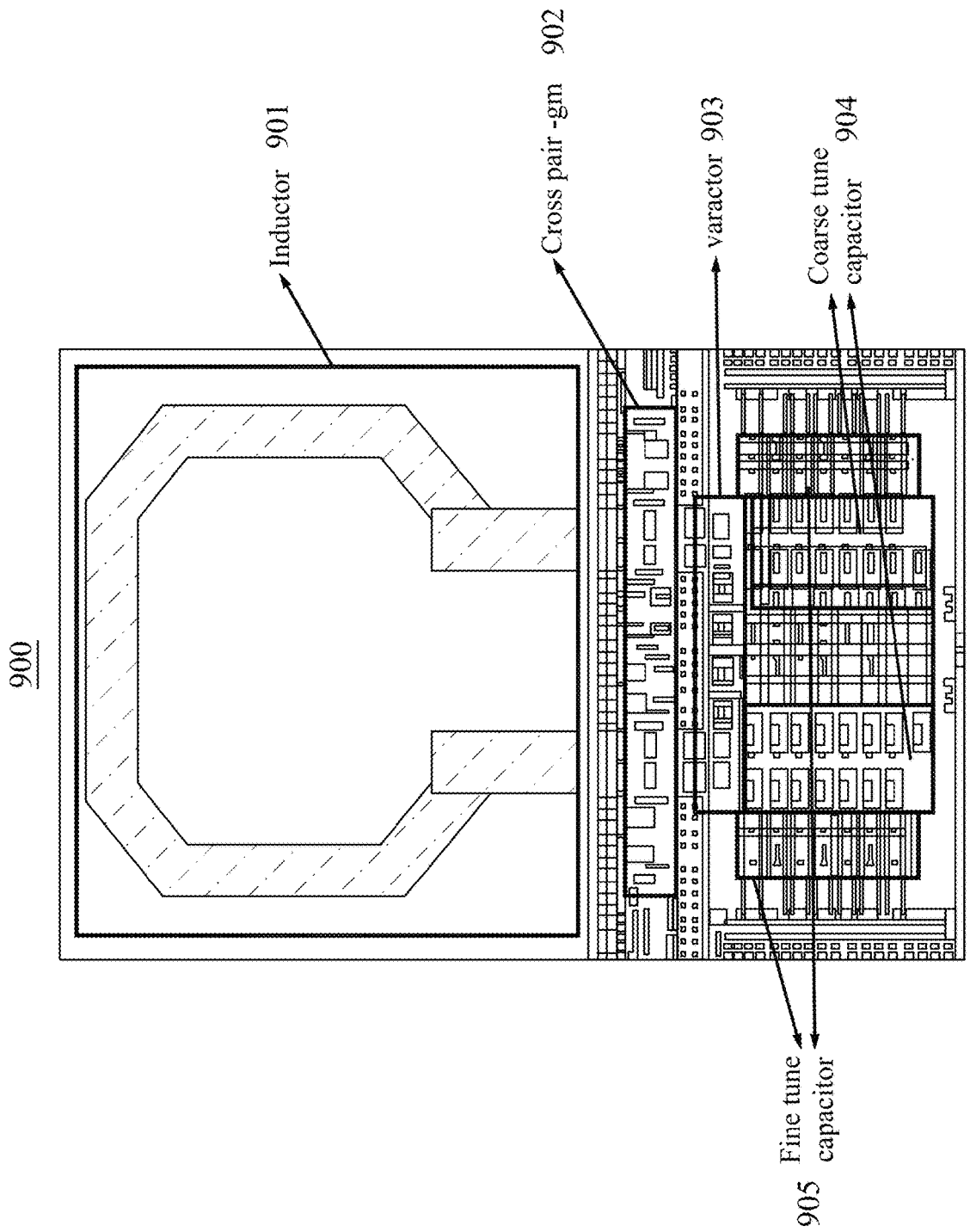
FIG. 9 is a diagram of a layout floorplan of an LC voltage controlled oscillator.

FIG. 9 is a diagram of a layout floorplan 900 of an LC voltage controlled oscillator 109 from top to bottom. The layout floorplan 900 includes a high-Q inductor 901, a constant-gm circuit 902, a varactor 903, a fine tuning capacitor 905, and a coarse tuning capacitor 904, as understood by one skilled in the art.

Figure 10:
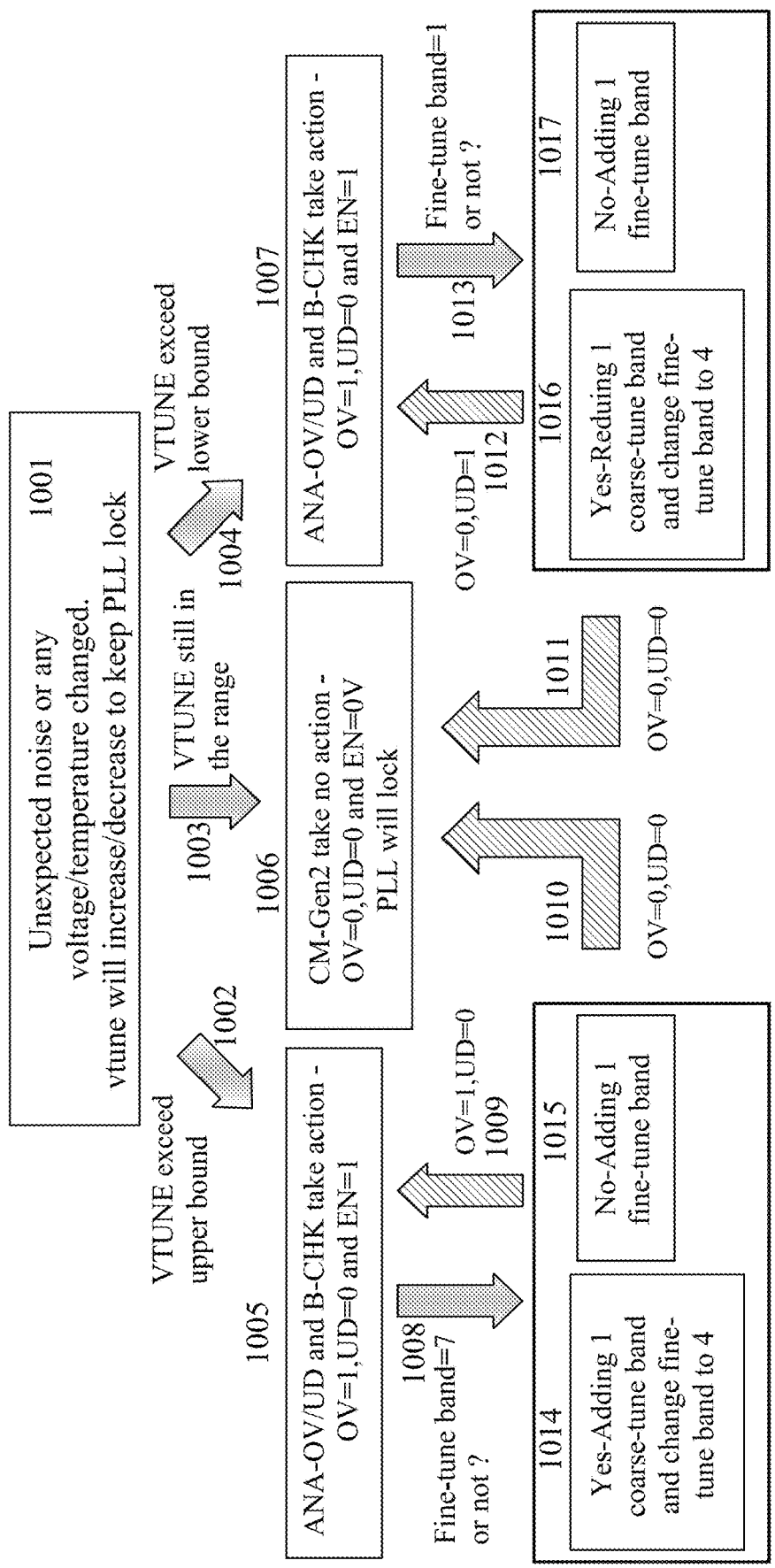
FIG. 10 is a flow chart of an operation of an LC voltage controlled oscillator.

FIG. 10 shows a flow chart of response of a phase locked loop of the present disclosure to an unexpected interference. For example, the phase locked loop may be affected by the testing environment. An unexpected noise, temperature change, or other factor may change the locking status of the phase locked loop. First, an unexpected noise or any voltage or temperature change may occur. In this case, VCO tuning signal $V_{TUNE}$ will increase or decrease to maintain a frequency of a VCO output signal that is locked onto an input reference signal. This is represented by block 1001. When the VCO tuning signal $V_{TUNE}$ exceeds an upper bound, as shown by arrow 1002, the overflow signal will be enabled, and the underflow signal will be disabled. The enablement signal 215 will also be active to enable the tuning array selection circuit. This is shown in block 1005. After this condition is met, the next consideration is whether the fine tuning binary code signal is equal to an upper value, as represented by arrow 1008. In the example shown in FIG. 10, this value is 7. Thus, if the fine tuning binary code signal is equal to 7, the coarse tuning binary code signal will be increased by 1 and the fine tuning binary code signal will be changed to a lower level, which in this example is 4. This is represented by block 1014. If the fine tuning binary code signal is not equal to 7, the fine tuning binary code signal will simply be increased by 1, as shown in block 1015.

Next, the state of the overflow and underflow signals must be considered. If both the overflow and underflow signals are 0, as shown by arrow 1010, the enablement signal 215 will be set to "0" and the tuning array selection circuit and LC voltage controlled oscillator will stop operation, as shown in block 1006. However, if the overflow signal is still enabled, as shown in arrow 1009, the tuning array selection circuit will be active and the process described in block 1005 will again be followed.

The circuit behaves in a similar way when the VCO tuning signal $V_{TUNE}$ 101 exceeds a lower bound, as shown in arrow 1004. When the VCO tuning signal $V_{TUNE}$ 101 drops below the analog voltage range, the underflow signal will be enabled and the enablement signal 215 will also be enabled, as shown in block 1007. After this condition is met, the next consideration is whether the fine tuning binary code signal is equal to a lower value, as shown in arrow 1013. In the example shown in FIG. 10, this value is 1. Thus, if the fine tuning binary code signal is equal to 1, the coarse tuning binary code signal will be decreased by 1 and the fine tuning binary code signal will be changed to a higher level, which in this example is 4. This is represented by block 1016. If the fine tuning binary code signal is not equal to 1, the fine tuning binary code signal will simply be decreased by 1, as shown in block 1017.

The next consideration is the value of the overflow and underflow signals. If both the overflow and underflow signals are disabled, as in arrow 1011, the tuning array selection circuit will be disabled and stop operating. However, if the underflow signal is still enabled, as in arrow 1012, the tuning array selection circuit and the boundary checker will be enabled, and the enablement signal 215 will be set to "1". There is a possibility that the VCO tuning signal $V_{TUNE}$ will be within the analog voltage range despite an unexpected noise or a voltage or temperature change, as represented by arrow 1003. In this case the enablement signal 215 will be set to "0" and no action will be taken, as shown in block 1006.

Figure 11A:
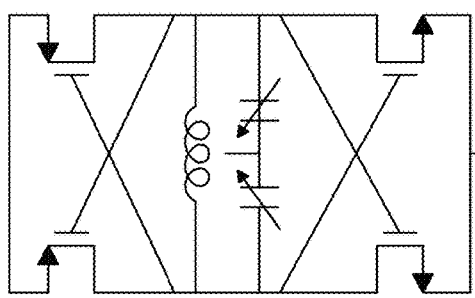
FIGS. 11A-11F are diagrams of different embodiments of an LC voltage controlled oscillator that may be employed by elements of the present disclosure.
Figure 11B:
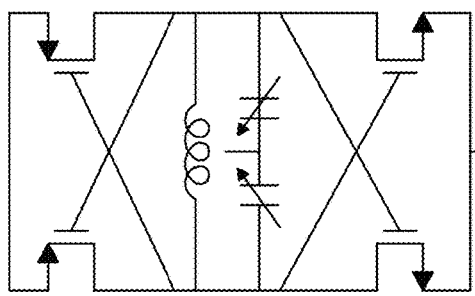
Figure 11C:
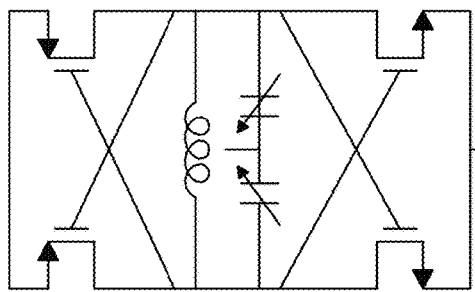
Figure 11D:
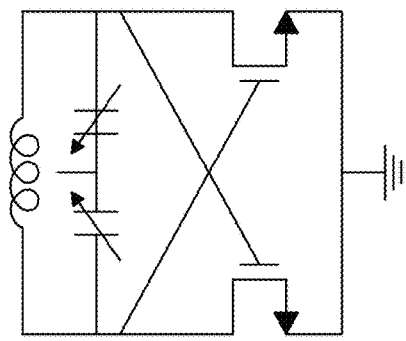
Figure 11E:
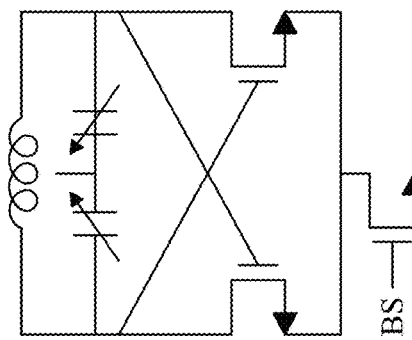
Figure 11F:
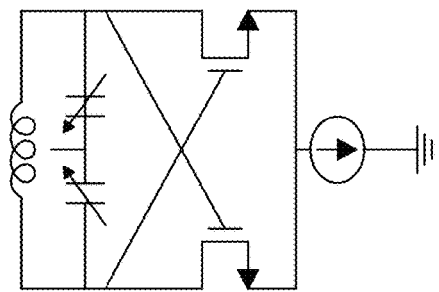

FIGS. 11A, 111B, 11C, 11D, 11E, and 11F display several different voltage controlled oscillator types that can utilize embodiments of the present disclosure. FIG. 11A shows a complimentary LC voltage controlled oscillator. FIG. 11D shows an n-channel MOSFET only LC voltage controlled oscillator. Voltage controlled oscillators of the present disclosure may use a bias n-channel MOSFET. For example, FIG. 11B shows a complimentary LC voltage controlled oscillator with a bias n-channel MOSFET. In addition, FIG. 11E shows an n-channel MOSFET only LC voltage controlled oscillator with a bias n-channel MOSFET. Voltage controlled oscillators utilizing embodiments of the present disclosure may also employ a current mirror. FIG. 11C displays a complimentary LC voltage controlled oscillator with a current mirror. Similarly, FIG. 11F shows an n-channel MOSFET only LC voltage controlled oscillator with a current mirror. In addition, other voltage controlled oscillators may be used that are within the spirit and scope of the present invention.

Figure 12:
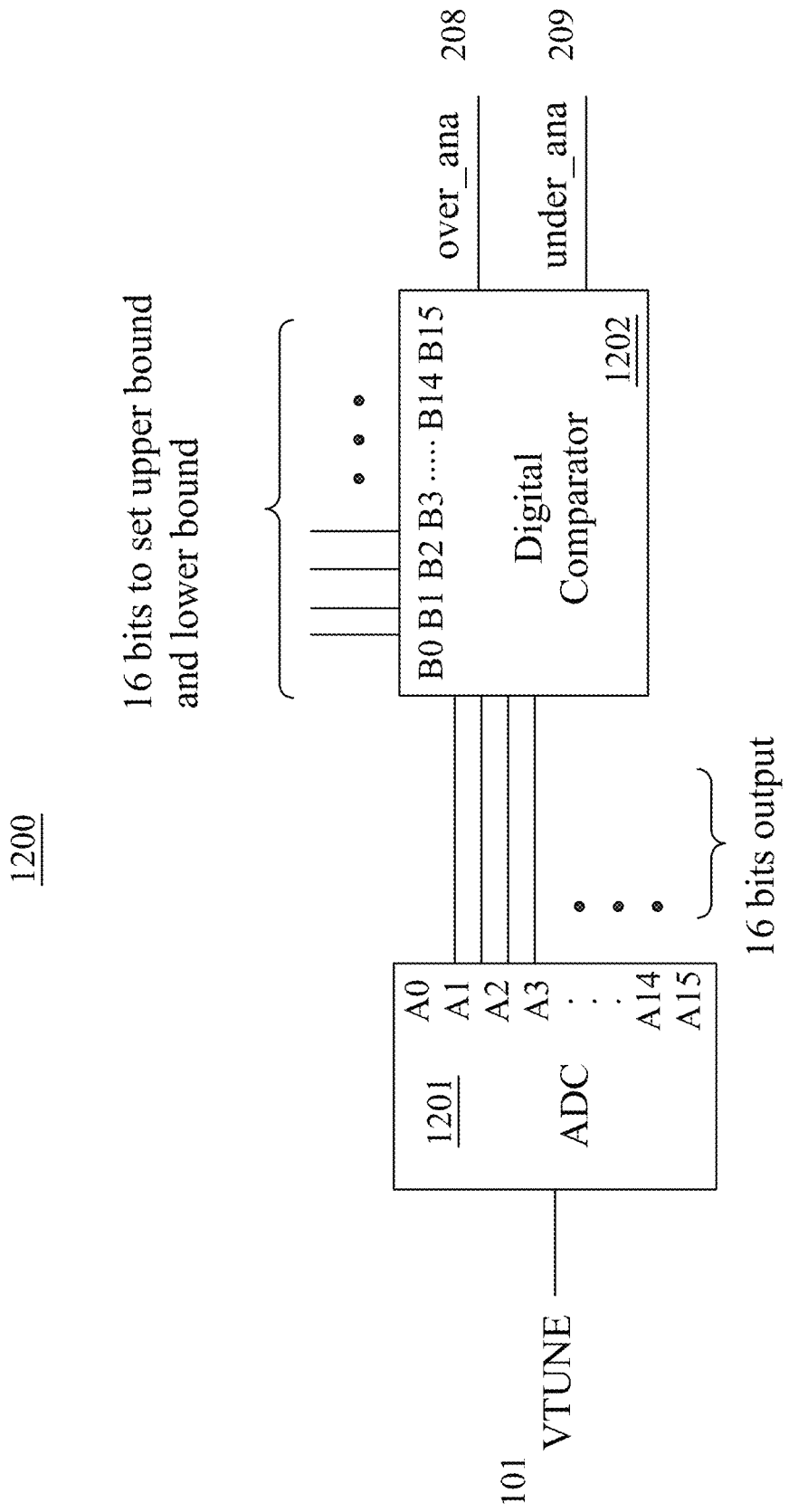
FIG. 12 is a diagram of an implementation of an overflow and underflow detector using digital components.

FIG. 12 is a diagram of a digital implementation on an overflow and underflow detector. The digital implementation of the overflow and underflow detector may be utilized by transferring the VCO tuning signal $V_{TUNE}$ 101 into 16 bits of digital code by using the analog to digital converter 1201. The 16 bits are represented in FIG. 12 as A0 to A15 in analog to digital converter 1201. 16 separate bits, B0 to B15, may be used to set the upper and lower bound for $V_{TUNE}$ 101. For example, the first 8 bits, B0-B7, may be used to set the lower bound of the VCO tuning signal $V_{TUNE}$ 101, while the last 8 bits, B8-B15, may be used to set the upper bound of the VCO tuning signal $V_{TUNE}$ 101. The VCO tuning signal $V_{TUNE}$ 101 may be compared to these upper and lower bounds by the means of a digital comparator 1202. In one example, if the supply voltage $V_{DD}$ is 0.8 V, 1 bit may cover 50 mV. Thus, when B0-B5 is set to 6'b111111, B6-B9 is set to 4'b0000, and B10-B15 is set to 6'b111111, the lower bound is set to 300 mV and the upper bound is set to 500 mV. If the VCO tuning signal $V_{TUNE}$ 101 is 400 mV, then the overflow signal 208 will be disabled and the underflow signal 209 will also be disabled. If the VCO tuning signal $V_{TUNE}$ 101 is 550 mV, then the overflow signal 208 will be enabled and the underflow signal 209 will be disabled. However, if the VCO tuning signal $V_{TUNE}$ 101 is 250 mV, then the overflow signal 208 will be disabled and the underflow signal 209 will be enabled.

Figure 13:
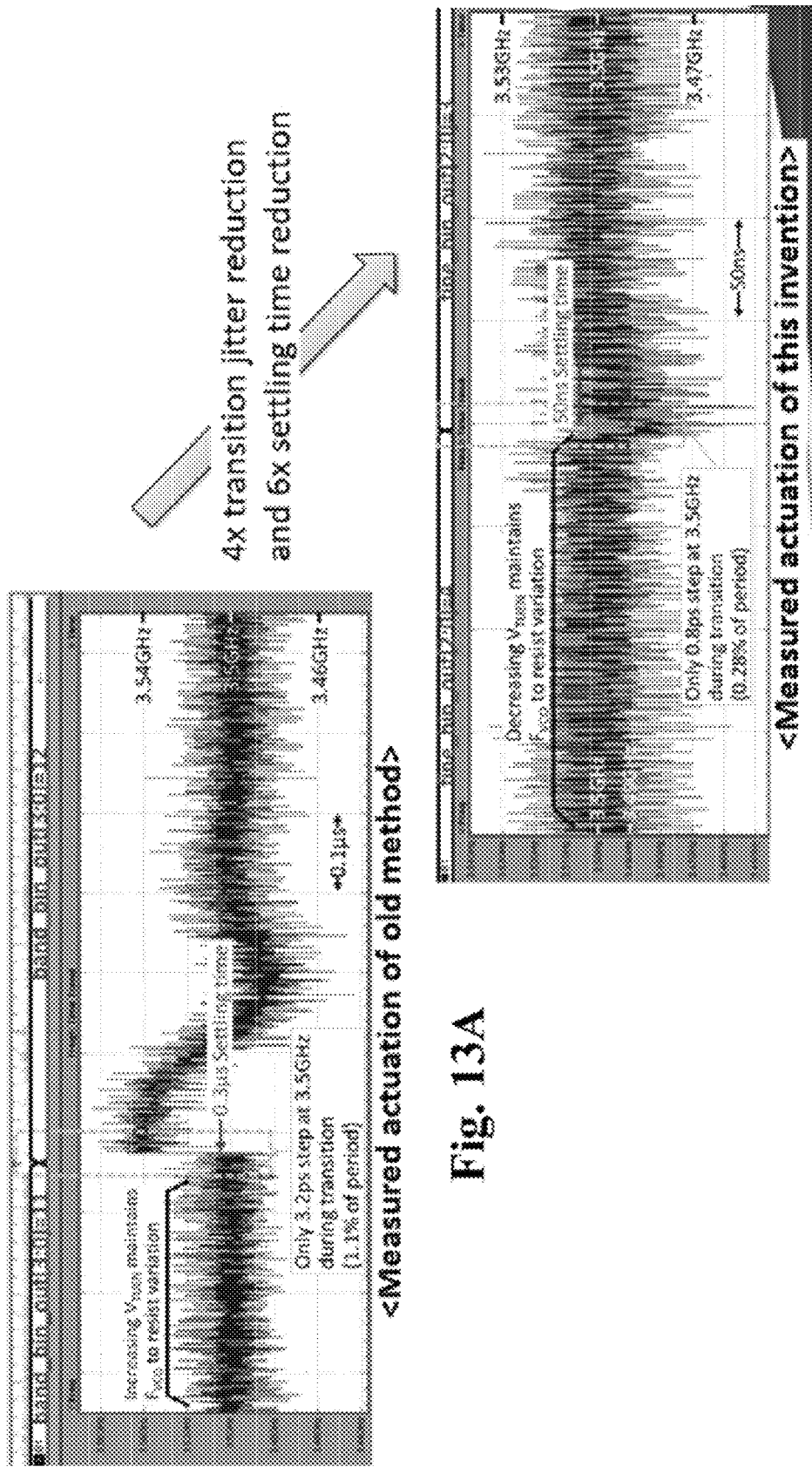
FIGS. 13A and 13B are diagrams respectively showing a waveform of a VCO output signal used in a previous method and a waveform of a VCO output signal used in a method of the present disclosure.

FIGS. 13A and 13B are diagrams showing a reduction in the transition jitter and settling time due to the effect of embodiments of the LC voltage controlled oscillator of the present disclosure. The transition jitter induced by the embodiments of the present disclosure may be reduced by a factor of 4, compared with previous methods. The settling time may be reduced by a factor of 6. The timing diagram of FIG. 13A shows a waveform of the VCO output signal using previous tuning methods. In previous methods, a transition at 3.5 GHz output frequency may yield a transition jitter of about 3.2 picoseconds, with a settling time of about 0.3 microseconds. The timing diagram of FIG. 13B shows a waveform of the VCO output signal using the methods of the present disclosure. With the systems and methods employed herein, the transition jitter may be reduced to 0.8 picoseconds, with a settling time of less than 50 nanoseconds.

Figure 14:
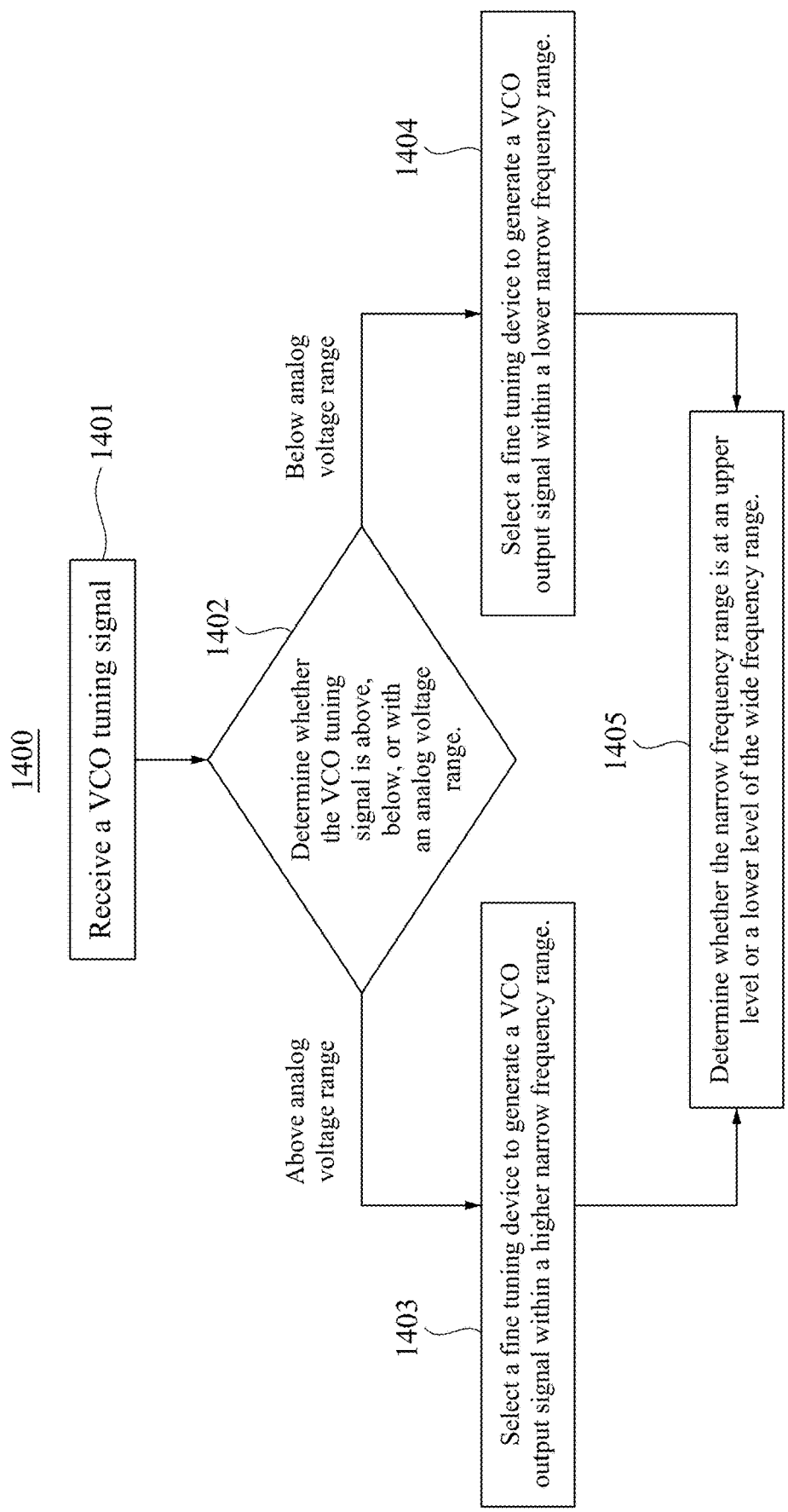
FIG. 14 is a flowchart showing a method of tuning an LC voltage controlled oscillator.

FIG. 14 is a diagram of a method 1400 of tuning an LC voltage controlled oscillator. In one example, the first step 1401 is to receive a VCO tuning signal. The next step 1402, according to the present example, is to determine whether the VCO tuning signal is above, below, or within an analog voltage range. If the VCO tuning signal is above the analog voltage range, the next step 1403 in the method is to select a fine tuning device to generate a VCO output signal within a higher narrow frequency range. However, if the VCO tuning signal is below the analog voltage range, the next step 1404 in the method is to select a fine tuning device to generate a VCO output signal within a lower narrow frequency range. The next step 1405, whether a fine tuning device was selected to generate a VCO output signal within a higher narrow frequency range or a lower narrow frequency range, is to determine whether the narrow frequency range is at an upper level or a lower level of the wide frequency range.

The foregoing detailed description discloses a phased lock loop. The phased lock loop of the present disclosure includes a voltage controlled oscillator (VCO) which comprises a coarse tuning array including a plurality of coarse tuning devices and a fine tuning array including a plurality of fine tuning devices. The VCO of the present disclosure may be configured to select a fine tuning device from the plurality of fine tuning devices in the fine tuning array to increase the frequency of a VCO output signal to a level within a higher narrow frequency range. Such a selection may be made based on a determination that a VCO tuning signal is above an analog voltage range.

The VCO may also be configured to select a fine tuning device from the plurality of fine tuning devices in the fine tuning array to decrease the frequency of the VCO output signal to a level within a lower narrow frequency range. Such a selection may be based on a determination the VCO tuning signal is below the analog voltage range. The VCO may be further configured to select a coarse tuning device from the plurality of coarse tuning devices in the coarse tuning array to increase the frequency of the VCO output signal to a level within a higher wide frequency range based on a determination that the VCO tuning signal is above the analog voltage range and the narrow frequency range is at an upper level within the wide frequency range.

The VCO may be further configured to select a coarse tuning device from the plurality of coarse tuning devices in the coarse tuning array to decrease the frequency of the VCO output signal to a level within a lower frequency range based on a determination that the VCO tuning signal is below the analog voltage range and the narrow frequency range is at a lower level within the wide frequency range.

The VCO of the of present disclosure may further be configured to receive one or more coarse tuning selection signals for selection of a coarse tuning device from the plurality of coarse tuning devices in the coarse tuning array. Furthermore, the VCO may be configured to receive one or more fine tuning selection signals for selection of a fine tuning device from the plurality of fine tuning devices in the fine tuning array. Each of the plurality of coarse tuning devices may be selectable to tune a VCO output signal to a different wide frequency range. Each of the plurality of fine tuning devices may be selectable to tune the VCO output signal to a different narrow frequency range within a wide frequency range of a selected coarse tuning device.

The VCO may be further configured to select a fine tuning device corresponding to a lower frequency level within the wide frequency range when the frequency of the VCO output signal generated by the fine tuning array is at an upper frequency level within the wide frequency range and the VCO tuning signal is above the analog voltage range. In such a way the VCO may be tuned to generate the VCO output signal with a net increase in frequency.

The VCO may also be configured to select a fine tuning device corresponding to a higher frequency level within the wide frequency range when the frequency of the VCO output signal generated by the fine tuning array is at a lower frequency level within the wide frequency range and the VCO tuning signal is below the analog voltage range. In this way the VCO may be tuned to generate the VCO output signal with a net decrease in frequency. The magnitude of the net increase and the net decrease in frequency of the VCO output signal may be less than the wide frequency range. The net increase and decrease in frequency of the VCO output signal may also induce a lower transition jitter in the phase locked loop than the transition jitter induced by a frequency increase of the VCO output signal equal to the frequency of the wide frequency range.

The phase locked loop of the present disclosure may also include a tuning array selection circuit. Such a tuning array selection circuit may be configured to receive the VCO tuning signal and to generate a coarse tuning binary code selection signal and a fine tuning binary code selection signal based on whether the VCO tuning signal is above, below, or within an analog voltage range.

The fine tuning binary code signal may be generated to indicate an increase in frequency of the VCO output signal to a level within a higher narrow frequency range. For example, this indication of an increase in frequency may occur when the VCO tuning signal is above the analog voltage range. The fine tuning binary code signal may be generated to indicate a decrease in frequency of the VCO output signal to a level within a lower narrow frequency range when the VCO tuning signal is below the analog voltage range.

The coarse tuning binary code signal may be generated to indicate an increase in frequency of the VCO output signal to a level within a higher wide frequency range. This indication may occur when the VCO tuning signal is above the analog voltage range and the narrow frequency range is at an upper level within the wide frequency range. The coarse tuning binary code signal may indicate a decrease in frequency of the VCO output signal to a level within a lower wide frequency range when the VCO tuning signal is below the analog voltage range and the narrow frequency range is at a lower level within the wide frequency range.

The phase locked loop of the present disclosure may further include a decoder. The decoder may be configured to receive the fine tuning binary code signal and the coarse tuning binary code signal, to convert the coarse tuning binary code signal into the one or more coarse tuning selection signals, and to convert the fine tuning binary code signal into the one or more fine tuning selection signals.

The phase locked loop of the present disclosure may also include an analog overflow and underflow detector, a fine tuning counter circuit, and a coarse tuning counter circuit. The analog overflow and underflow circuit may be configured to receive the VCO tuning signal and to generate an overflow signal when the VCO tuning signal is above the analog voltage range. The analog overflow and underflow detector may also be configured to generate an underflow signal when the VCO tuning signal is below the analog voltage range.

The fine tuning counter circuit may be configured to receive the overflow and underflow signals. It may also be configured to determine whether the VCO is able to generate the VCO output signal that is proportional to the reference input signal with the selected fine tuning device based on the enablement of the overflow and underflow signals. The fine tuning counter circuit may also be configured to determine whether the narrow frequency range of the selected fine tuning device is at an upper or lower level within the wide frequency rage, and to generate an upper frequency level boundary signal when the narrow frequency range is at an upper level within the wide frequency range. The fine tuning counter circuit may also be configured to generate a lower frequency level boundary signal when the narrow frequency range is at a lower level within the wide frequency range. Furthermore, the fine tuning counter circuit may generate a fine tuning binary code signal corresponding to a higher narrow frequency range when the overflow signal is enabled, and generate a fine tuning binary code signal corresponding to a lower narrow frequency range when the underflow signal is enabled.

The coarse tuning counter circuit of the phase locked loop of the present disclosure may be configured to receive the one or more frequency level boundary signals and a binary code input signal and to determine whether the VCO is able to generate the VCO output signal that is proportional to the reference input signal with the selected coarse tuning device. The coarse tuning counter circuit may generate a coarse tuning binary code signal corresponding to a higher wide frequency range when the upper frequency level boundary signal is enabled and the VCO is unable to generate the VCO output signal that is proportional to the reference input signal with the selected coarse tuning device. The coarse tuning device may also be configured to generate a coarse tuning binary code signal corresponding to a lower wide frequency range when the lower frequency level boundary signal is enabled and the VCO is unable to generate the VCO output signal that is proportional to the reference input signal with the selected coarse tuning device.

The tuning array selection circuit of the present disclosure may further include a boundary checker that is configured to receive the coarse tuning binary code signal and to determine whether the coarse tuning device corresponds to an upper or lower boundary of a VCO output signal frequency range based upon the coarse tuning binary code signal. The tuning array selection circuit may also be configured to generate an enablement signal that can be used to disable the tuning array selection circuit when the coarse tuning device corresponds to an upper or lower boundary of the VCO output signal frequency range.

The tuning array selection circuit of the present disclosure may also include a frequency divider configured to receive a reference input signal and to calculate a frequency of a reduced frequency signal based on the reference input signal. The frequency divider may also be configured to calculate a frequency of a reduced frequency signal based on the reference input signal, and to generate the reduced frequency signal. Such a reduced frequency signal may be equal to the frequency of the reference input signal divided by a predetermined constant.

In one example embodiment of the present disclosure, the coarse tuning devices and fine tuning devices of the present disclosure may be capacitors.

The present disclosure also discloses a VCO which may be composed of a coarse tuning array including a plurality of coarse tuning devices and a fine tuning array including a plurality of fine tuning devices. In one example embodiment of the present disclosure, the VCO may be an inductance-capacitance voltage controlled oscillator (LC VCO).

The foregoing detailed description also discloses a method of tuning a voltage controlled oscillator (VCO). In one example, the method may include a first step of receive a VCO tuning signal. The method may further include the step of determining whether the VCO tuning signal is above, below, or within an analog voltage range. Another step of the method may include selecting a fine tuning device to generate a VCO output signal within a higher narrow frequency range when the VCO tuning signal is above the analog voltage range. Another step may be to select a fine tuning device to generate the VCO output signal within a lower narrow frequency range when the VCO tuning signal is below the analog voltage range. The method may also involve determining whether the narrow frequency range is at an upper or a lower level of the wide frequency range.

The method of tuning an LC voltage controlled oscillator may also include the step of selecting a coarse tuning device corresponding to a higher wide frequency range and selecting a fine tuning device corresponding to a lower level within the wide frequency range. Such coarse and fine tuning devices may be selected when the VCO tuning signal is above the analog voltage range and the narrow frequency range is at an upper level within the wide frequency range. In this way the magnitude of frequency change in the VCO output signal may be less than the wide frequency range.

The method of tuning an LC voltage controlled oscillator may also include the step of selecting a coarse tuning device corresponding to a lower wide frequency range and selecting a fine tuning device corresponding to a higher level within the wide frequency range. Such coarse and fine tuning devices may be selected when the VCO tuning signal is below the analog voltage range and the narrow frequency range is at a lower level within the wide frequency range.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase locked loop, comprising:
   a voltage controlled oscillator (VCO) configured to receive a VCO tuning signal and comprising a coarse tuning array including a plurality of coarse tuning devices and a fine tuning array including a plurality of fine tuning devices; and
   a tuning array selection circuit including:
      an analog overflow and underflow detector configured to determine whether the VCO tuning signal is above or below an analog voltage range;
      a fine tuning counter circuit configured to generate a fine tuning binary code signal; and
      a coarse tuning counter circuit configured to generate a coarse tuning binary code signal,
   wherein, when it is determined by the analog overflow and underflow detector that the VCO tuning signal is above the analog voltage range and when it is determined by the fine tuning counter circuit that a selected first fine tuning device of the plurality of fine tuning devices corresponds to a first frequency range below an upper level within a second frequency range, a second fine tuning device is selected by the fine tuning binary code signal from the plurality of fine tuning devices in the fine tuning array to increase a frequency of a VCO output signal to a level within a higher first frequency range,
   wherein, when it is determined by the analog overflow and underflow detector that the VCO tuning signal is below the analog voltage range and when it is determined by the fine tuning counter circuit that the selected first fine tuning device corresponds to a first frequency range above a lower level within the second frequency range, a third fine tuning device is selected by the fine tuning binary code signal from the plurality of fine tuning devices in the fine tuning array to decrease the frequency of the VCO output signal to a level within a lower first frequency range,
   wherein, when it is determined by the analog overflow and underflow detector that the VCO tuning signal is above the analog voltage range and when it is determined by the fine tuning counter circuit that the selected first fine tuning device corresponds to a first frequency range at an upper level within the second frequency range, a first coarse tuning device is selected by the coarse tuning binary code signal from the plurality of coarse tuning devices in the coarse tuning array to increase the frequency of the VCO output signal to a level within a higher second frequency range, and
   wherein, when it is determined by the analog overflow and underflow detector that the VCO tuning signal is below the analog voltage range and when it is determined by the fine tuning counter circuit that the selected first fine tuning device corresponds to a first frequency range at a lower level within the second frequency range, a second coarse tuning device is selected by the coarse tuning binary code signal from the plurality of coarse tuning devices in the coarse tuning array to decrease the frequency of the VCO output signal to a level within a lower second frequency range.

2. The phase locked loop of claim 1, further comprising a decoder configured to receive the fine and coarse tuning binary code signals, to generate one or more coarse tuning selection signals for selection of a coarse tuning device from the plurality of coarse tuning devices in the coarse tuning array, and to generate one or more fine tuning selection signals for selection of a fine tuning device from the plurality of fine tuning devices in the fine tuning array.

3. The phase locked loop of claim 2, wherein a fine tuning device corresponding to a lower frequency level within the second frequency range is selected when the frequency of the VCO output signal generated by the fine tuning array is at an upper frequency level within the second frequency range and the VCO tuning signal is above the analog voltage range, such that the VCO is tuned to generate the VCO output signal with a net increase in frequency, and a fine tuning device corresponding to a higher frequency level within the second frequency range is selected when the frequency of the VCO output signal generated by the fine tuning array is at a lower frequency level within the second frequency range and the VCO tuning signal is below the analog voltage range, such that the VCO is tuned to generate the VCO output signal with a net decrease in frequency.

4. The phase locked loop of claim 3, wherein the magnitude of the net increase and the net decrease in frequency of the VCO output signal is less than the second frequency range.

5. The phase locked loop of claim 4, wherein the net increase and decrease in frequency of the VCO output signal induces a lower transition jitter in the phase locked loop than the transition jitter induced by a frequency increase of the VCO output signal equal to the frequency of the second frequency range.

6. The phase locked loop of claim 1, further comprising:
   a decoder configured to receive the fine tuning binary code signal and the coarse tuning binary code signal, to convert the coarse tuning binary code signal into the one or more coarse tuning selection signals, and to convert the fine tuning binary code signal into the one or more fine tuning selection signals.

7. The phase locked loop of claim 6, wherein:
   the analog overflow and underflow detector is configured to receive the VCO tuning signal, to generate an overflow signal when the VCO tuning signal is above the analog voltage range, and to generate an underflow signal when the VCO tuning signal is below the analog voltage range;
   the fine tuning counter circuit is configured to receive the overflow and underflow signals, to determine whether the VCO is able to generate the VCO output signal that is proportional to a reference input signal with the selected first fine tuning device based on the enablement of the overflow and underflow signals, to determine whether the first frequency range of the selected first fine tuning device is at an upper or lower level within the second frequency range, to generate an upper frequency level boundary signal when the first frequency range is at an upper level within the second frequency range, to generate a lower frequency level boundary signal when the first frequency range is at a lower level within the second frequency range, to generate a fine tuning binary code signal corresponding to a higher first frequency range when the overflow signal is enabled, and to generate a fine tuning binary code signal corresponding to a lower first frequency range when the underflow signal is enabled; and the coarse tuning counter circuit is configured to receive one or more frequency level boundary signals and a binary code input signal, to determine whether the VCO is able to generate the VCO output signal that is proportional to the reference input signal with a selected coarse tuning device based on the frequency level boundary signal and the binary code input signal, to generate a coarse tuning binary code signal corresponding to a higher second frequency range when the upper frequency level boundary signal is enabled and the VCO is unable to generate the VCO output signal that is proportional to the reference input signal with the selected second coarse tuning device, and to generate a coarse tuning binary code signal corresponding to a lower second frequency range when the lower frequency level boundary signal is enabled and the VCO is unable to generate the VCO output signal that is proportional to the reference input signal with the selected second coarse tuning device.

8. The phase locked loop of claim 7, wherein the tuning array selection circuit further comprises a boundary checker configured to receive the coarse tuning binary code signal, to determine whether the coarse tuning device corresponds to an upper or lower boundary of a VCO output signal frequency range based upon the coarse tuning binary code signal, and to generate an enablement signal that can be used to disable the tuning array selection circuit when the coarse tuning device generates a VCO output signal to an upper or lower boundary of the VCO output signal frequency range.

9. The phase locked loop of claim 8, the tuning array selection circuit further comprising a frequency divider configured to receive the reference input signal, to calculate a frequency of a reduced frequency signal based on the reference input signal, and to generate the reduced frequency signal, wherein the frequency of the reduced frequency signal is equal to the frequency of the reference input signal divided by a predetermined constant.

10. The phase locked loop of claim 1, wherein the coarse tuning devices are capacitors and the fine tuning devices are capacitors.

11. A phase locked loop comprising:
a voltage controlled oscillator (VCO) configured to receive fine and coarse tuning selection signals and to detect a VCO tuning signal and comprising a coarse tuning array including a plurality of coarse tuning devices and a fine tuning array including a plurality of fine tuning devices;
an analog overflow and underflow detector;
fine tuning counter circuit; and
a decoder configured to generate the fine and coarse tuning selection signals,
wherein, when it is detected by the analog overflow and underflow detector that the VCO tuning signal is above an analog voltage range and when it is determined by the fine tuning counter circuit that a selected first fine tuning device of the plurality of fine tuning devices corresponds to a first frequency range below an upper level within a second frequency range, a second fine tuning device is selected by the fine tuning selection signal from the plurality of fine tuning devices in the fine tuning array to increase a frequency of a VCO output signal to a level within a higher first frequency range, wherein, when it is detected by the analog overflow and underflow detector that the VCO tuning signal is below the analog voltage range and when it is determined by the fine tuning counter circuit that the selected first fine tuning device corresponds to a first frequency range above a lower level within the second frequency range, a third fine tuning device is selected by the fine tuning selection signal from the plurality of fine tuning devices in the fine tuning array to decrease the frequency of the VCO output signal to a level within a lower first frequency range, wherein, when it is detected by the analog overflow and underflow detector that the VCO tuning signal is above the analog voltage range and when it is determined by the fine tuning counter circuit that the selected first fine tuning device corresponds to a first frequency range at an upper level within the second frequency range, a first coarse tuning device is selected by the coarse tuning selection signal from the plurality of coarse tuning devices in the coarse tuning array to increase the frequency of the VCO output signal to a level within a higher second frequency range, and wherein, when it is detected by the analog overflow and underflow detector that the VCO tuning signal is below the analog voltage range and when it is determined by the fine tuning counter circuit that the selected first fine tuning device corresponds to a first frequency range at a lower level within the second frequency range, a second coarse tuning device is selected by the coarse tuning selection signal from the plurality of coarse tuning devices in the coarse tuning array to decrease the frequency of the VCO output signal to a level within a lower second frequency range.

12. The phase locked loop of claim 11, wherein
a fine tuning device corresponding to a lower frequency level within the second frequency range is selected by the fine tuning selection signal when the frequency of the VCO output signal generated by the fine tuning array is at an upper frequency level within the second frequency range and the VCO tuning signal is above the analog voltage range, such that the VCO is tuned to generate the VCO output signal with a net increase in frequency, and
a fine tuning device corresponding to a higher frequency level within the second frequency range is selected by the fine tuning selection signal when the frequency of the VCO output signal generated by the fine tuning array is at a lower frequency level within the second frequency range and the VCO tuning signal is below the analog voltage range, such that the VCO is tuned to generate the VCO output signal with a net decrease in frequency.

13. The phase locked loop of claim 12, wherein the magnitude of the net increase and the net decrease in frequency of the VCO output signal is less than the second frequency range.

14. The phase locked loop of claim 13, wherein the net increase and decrease in frequency of the VCO output signal induces a lower transition jitter in the phase locked loop than the transition jitter induced by a frequency increase of the VCO output signal equal to the frequency of the second frequency range.

15. The phase locked loop of claim 14, wherein the VCO is an inductance-capacitance voltage controlled oscillator (LC VCO).

16. A method of tuning a voltage controlled oscillator (VCO), comprising:
receiving a VCO tuning signal;
determining whether the VCO tuning signal is above, below, or within an analog voltage range;
selecting a fine tuning device to generate a VCO output signal within a higher narrow frequency range when the VCO tuning signal is above the analog voltage range;
selecting a fine tuning device to generate the VCO output signal within a lower narrow frequency range when the VCO tuning signal is below the analog voltage range; and
determining whether the narrow frequency range is at an upper level or a lower level of a wide frequency range.

17. The method of claim 16, further comprising the step of:
selecting a coarse tuning device corresponding to a higher wide frequency range and selecting a fine tuning device corresponding to a lower level within the wide frequency range when the VCO tuning signal is above the analog voltage range and the narrow frequency range is at an upper level within the wide frequency range.

18. The method of claim 17, wherein the magnitude of frequency change in the VCO output signal is less than the wide frequency range.

19. The method of claim 16, further comprising the step of:
selecting a coarse tuning device corresponding to a lower wide frequency range and selecting a fine tuning device corresponding to a higher level within the wide frequency range when the VCO tuning signal is below the analog voltage range and the narrow frequency range is at a lower level within the wide frequency range.

20. The method of claim 19, wherein the magnitude of frequency change in the VCO output signal is less than the wide frequency range.

* * * * *